United States Patent
Albrecht

(10) Patent No.: US 6,798,810 B2
(45) Date of Patent: Sep. 28, 2004

(54) SURFACE-EMITTING LASER HAVING LATERAL CURRENT INJECTION

(75) Inventor: Tony Albrecht, Bad Abbach (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/343,815

(22) PCT Filed: Jul. 31, 2001

(86) PCT No.: PCT/DE01/02903

§ 371 (c)(1),
(2), (4) Date: Jun. 5, 2003

(87) PCT Pub. No.: WO02/13334

PCT Pub. Date: Feb. 14, 2002

(65) Prior Publication Data

US 2003/0179802 A1 Sep. 25, 2003

(51) Int. Cl.[7] ................................................. H01S 3/19
(52) U.S. Cl. ......................................................... 372/45
(58) Field of Search ........................................... 372/45

(56) References Cited

U.S. PATENT DOCUMENTS

| | | | | |
|---|---|---|---|---|
| 5,256,596 A | * | 10/1993 | Ackley et al. | 438/39 |
| 5,258,316 A | * | 11/1993 | Ackley et al. | 438/42 |
| 5,343,487 A | | 8/1994 | Coldren | |
| 5,729,566 A | * | 3/1998 | Jewell | 372/96 |
| 5,831,295 A | * | 11/1998 | Huang et al. | 257/192 |
| 5,879,961 A | * | 3/1999 | Scott | 438/32 |
| 5,903,588 A | * | 5/1999 | Guenter et al. | 372/46 |
| 5,936,266 A | | 8/1999 | Wierer | |
| 6,044,100 A | | 3/2000 | Hobson et al. | |
| 6,075,804 A | * | 6/2000 | Deppe et al. | 372/96 |
| 6,169,756 B1 | * | 1/2001 | Chirovsky et al. | 372/46 |
| 6,534,331 B2 | * | 3/2003 | Liao et al. | 438/46 |
| 2003/0179802 A1 | * | 9/2003 | Albrecht | 372/96 |

OTHER PUBLICATIONS

Robert W. Herrick et al., "Improved reliability of red GainP vertical–cavity surface–emitting lasers using bias–induced annealing." Appl. Phys. Lett., vol. 72, No. 15, April, 1998 pp. 1799–1801.

Deppe D.G. et al., "Bistability in an AIAS–GaAs–InGaAs vertical–cavity surface–emitting laser", Appl. Phys. Lett., vol. 58, No. 23, 1991, pp. 2616–2618.

Wipiejewski T. et al., "Performance and Reliabilty of Oxide Confined VCSELs", 1999 Electronic Components and Technology Conference, June 1999, pp. 741–746.

Near M. Margalit et al., "Vertical Cavity Lasers for Telecom Applications", IEEE Communications Magazine, May 1997 pp. 164–170.

* cited by examiner

Primary Examiner—Leon Scott, Jr.
(74) Attorney, Agent, or Firm—Cohen, Pontani, Lieberman & Pavane

(57) ABSTRACT

The invention describes a surface-emitting laser (VCSEL) with lateral current injection. The pump current (4), from the contact face (2) on the decoupling side, in a first region (12) outside the resonator volume, is carried predominantly parallel to the resonator axis, and in a second region (13) is conducted predominantly perpendicularly to the active volume (9).

A contact geometry is also described, which brings about automatic regulation of the size of the active volume (9) as a function of the pump current (4).

14 Claims, 4 Drawing Sheets

Schnitt A - A

Schnitt A - A

SURFACE-EMITTING LASER HAVING LATERAL CURRENT INJECTION

This is a U.S. national stage of application No. PCT/DE01/02903, filed on 31 Jul. 2001.

FIELD OF THE INVENTION

The present invention is directed to an improved surface-emitting laser which avoids the disadvantages created by the formation of a positive thermal lens.

BACKGROUND OF THE INVENTION

Surface-emitting lasers with a vertical resonator (vertical cavity surface emitting lasers or VCSELs) are known for instance from IEEE Communications Magazine, May 97, pp. 164–170. These lasers contain a semiconductor body and share the structural feature that the resonator axis and thus the light emission as well are effected perpendicular to a primary face of the semiconductor body.

The pump current is typically introduced into the semiconductor body via contact faces. It is known that it is possible to dispose a contact face in the form of a ring contact on one primary face of the semiconductor body, with the laser radiation being decoupled through this primary face.

From the ring contact, the pump current is carried directly to the active layer of the semiconductor body. To achieve a pump density and to keep the threshold current low, the pump current is concentrated on a small volume of the active layer, hereinafter called the "active volume", with the aid of an aperture-like current-constriction layer. The generation and amplification of the laser radiation takes place in this active volume.

With this geometry, the path of the pump current through the semiconductor body (current path) and the generated radiation field in the semiconductor body (light path) are in major parts coincident. As a result, the radiation field and in particular its spatial field distribution are affected by the pump current, since as a function of the pump current, the electrical heat loss and thus the temperature of the semiconductor body are varied. As the pump current increases, a radially symmetrical temperature profile develops in the resonator. Because of the dependency of the index of diffraction of the semiconductor body on the temperature, thermal indexing arises, also known as a positive thermal lens.

A positive thermal lens leads to a constriction in the fundamental mode of the resonator, so that the overlap between the fundamental mode and the active volume, and thus the amplification of the fundamental mode, are reduced. Spatial hole burning reduces the amplification of the fundamental mode further, to the point of extinction of the fundamental mode. This also promotes the stimulation of oscillations of unwanted higher modes, making a fundamental mode operation (single mode operation or SM) impossible when the pump current is high.

This disadvantage is ameliorated if the light path and current path are separated. VCSELs with a partial separation of the light path and current path are known, for instance from U.S. Pat. No. 6,044,100. The so-called lateral injection described therein entails high production effort and expense, since for its development, expensive mesa etching of the semiconductor body using an etch stop layer is necessary.

Also in the VCSEL described in U.S. Pat. No. 6,044,100, the size of the active volume is fixedly specified and is determined essentially by the inside diameter of the current-constriction layer, so that the VCSEL is optimized for only a single operating point.

SUMMARY OF THE INVENTION

One object of the present invention is to create a VCSEL with improved current carrying, which at the same time can be produced economically.

The object of the present invention is therefore to create a VCSEL with improved current carrying, which at the same time can be produced economically. This object is attained by a VCSEL as defined by claim 1. Advantageous refinements are the subject of the dependent claims.

This and other objects are attained in accordance with one aspect of the present invention directed to a VCSEL having a semiconductor body, which has a resonator volume with a resonator axis, an active layer that includes an active volume that generates a radiation, and a first and a second primary face. A first contact face is formed on the first primary face and a second contact face is formed on the second primary face. The generated radiation is decoupled at least in part through the first primary face. The pump current in a first region is guided from the first primary face to the active layer, outside the resonator volume, predominantly parallel to the resonator axis. In a second region, the pump current is carried to the active volume predominantly perpendicular to the resonator axis, and an insulation layer (11) is embodied between the first region and the resonator volume.

Since the pump current is largely kept away from the resonator volume, the temperature increase caused by the electrical power loss, and especially the resultant temperature gradient in the resonator, are reduced. Thus in the resonator volume, the development of a positive thermal lens is avoided. This more-uniform temperature behavior, which is due to the improved current carrying, highly advantageously prevents a constriction of the fundamental mode and the unwanted stimulation of oscillations of higher modes as the pump current increases.

A further factor is that because of electrical losses, a temperature increase in the semiconductor body takes place outside the resonator volume. This conversely leads to a negative thermal lens in the resonator, which likewise counteracts a constriction of the fundamental mode. To great advantage, the invention thus makes VCSELs with high efficiency, high slope efficiency, and a high quantum yield possible that can be operated in the fundamental mode over a wide pump current range.

In an especially preferred embodiment of the invention, the carrying of the pump current outside the resonator is achieved by providing that an electrical insulation layer is embodied between the current-carrying first region outside the resonator and the resonator itself. Thus the existing semiconductor body is advantageously used for carrying current. Moreover, this insulation structure can advantageously be integrated into existing VCSEL structures without major effort or expense.

In a preferred refinement of the invention, the insulation layer is embodied by ion implantation. Targeted ion implantation in the region to be insulated creates a high number of lattice defects, so that in this region, the semiconductor degrades toward the electrical insulator. This often-used and therefore readily available method of embodying the insulation layer is advantageously utilized in the invention.

Alternatively, the insulation layer can be embodied by means of an etched trench. The etched trench can remain open or can be filled with an insulation or absorber material. Absorber materials, besides their insulating property, have high absorption in the spectral range of the laser emission wavelength. This absorption in the outer region of the resonator suppresses higher modes and thus reinforces the fundamental mode operation.

Forming insulation layers in the course of producing semiconductor bodies is known and has stood the test of time, and thus it advantageously requires no special effort or expense. Moreover, a semiconductor body formed in this way can more easily be provided with highly conductive ohmic contacts than a semiconductor body with mesa etching, for instance.

A preferred refinement of the invention comprises embodying the contact face on the decoupling face annularly. In operation, the generated laser radiation is decoupled through the annular opening. The VCSEL thus formed has an excellent beam quality, and the ring contact advantageously causes only slight shading of the decoupling face.

In a particularly preferred refinement of the invention, the contact face is embodied annularly, and the contact face is not closed. Alternatively, the contact face can be embodied as U-shaped. A V-shaped embodiment of the contact is especially preferred.

These contact shapes will hereinafter be called "open contacts", in contrast to a closed ring contact. Open contacts cause the size of the active volume to depend on the pump current, so that it becomes larger as the pump current increases. Thus a self-regulating behavior of the VCSEL is achieved, with the great advantage that the VCSEL is optimized not for a single operating point but rather for an operating range.

Advantageous contact shapes for the self-regulation are ring contacts with an unsplit ring, U-shaped contacts, and V-shaped contacts; in terms of the self-regulating properties, V-shaped contacts are especially advantageous.

In this refinement of the invention, the active volume is advantageously optimally adapted particularly for low pump currents as well, so that a thus-formed VCSEL is distinguished by a very low threshold current and high slope efficiency.

Another preferred embodiment of the invention comprises adapting the lateral cross section of the insulation layer to the shape of the contact face on the decoupling face.

The term "lateral cross section" means a cross section with a sectional plane orthogonal to the resonator axis. This adaptation advantageously assures that the pump current, along the shape of the contact in the second region, is delivered uniformly radially to the active volume and thus reinforces the self-regulation mechanism.

DETAILED DESCRIPTION OF THE DRAWINGS

Figure 1:
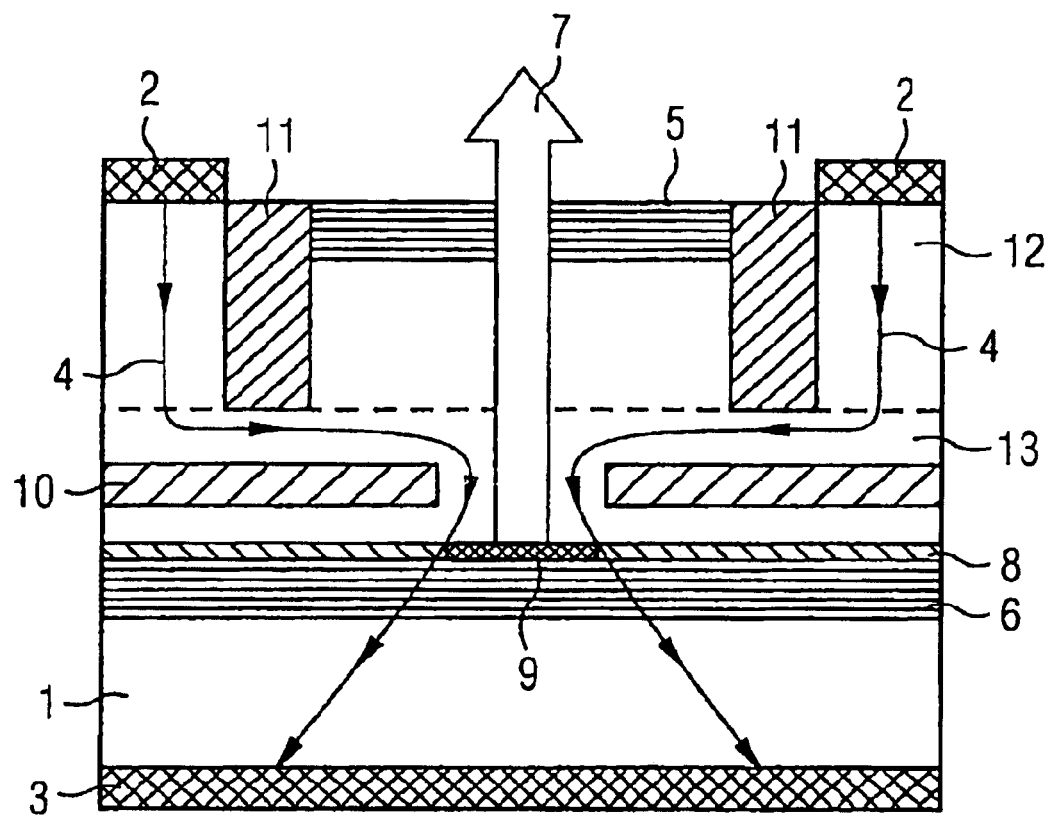
FIG. 1 shows a schematic sectional view through a first exemplary embodiment of the invention, with the resonator axis being located in the plane of the section.

Identical or identically functioning elements are provided with the same reference numerals throughout.

In FIG. 1, a sectional view through a first exemplary embodiment of the invention is shown, with the resonator axis located in the sectional plane. What is shown is the semiconductor body 1 of a VCSEL, with a first and a second primary face, on each of which a respective contact face 2 and 3 for delivering and removing the pump current 4 are formed. The resonator is defined by the mirrors 5 and 6, and the generated laser radiation 7 is decoupled via the mirror 5 and the first primary face. The contact 2 mounted on this primary face is a ring contact or an open contact.

The active layer 8 adjoins the second resonator mirror 6, and the active volume 9 is embodied in operation in the center of this active layer. In the direction of the decoupling face, above the active layer, a current-constriction layer 10 in the form of an annular insulation layer with a conductive center is formed, which concentrates the pump current 4 in the center of the active layer 8.

Around the resonator volume, an insulation layer 11 is formed, which extends in the direction of the resonator axis from the decoupling face to the vicinity of the current-constriction layer 10. This insulation layer 11 effects a defined carrying of the pump current 4, so that the pump current, in a first region 12 outside the resonator, is guided parallel to the resonator axis.

In a VCSEL of the prior art, conversely, the pump current penetrates the resonator volume over a direct course to the opening in the current-constriction layer, and thus causes the above-described, disadvantageous thermal effects in the resonator. In a second region 13 adjoining the current-constriction layer 10, the current is then guided through the conductive gap between the insulation layer 11 and the current-constriction layer 10 radially to the opening in the current-constriction layer 10.

The insulation layer 11 can be produced for instance by ion implantation, using a suitable mask. The depth of the layer (in the direction of the resonator axis) and thus the size of the gap between the insulation layer 11 and the current-constriction layer 10 is determined by the ion energy. The same method can also be employed to form the current-constriction layer 10.

Alternatively, the current-constriction layer 10 can also be formed by means of a suitably masked oxide layer.

A further possibility for forming the insulation layer 11 is to etch a trench between the first region 12 and the resonator volume. The depth of the trench is defined by the duration of etching, so that the complicated development of an etch stop layer is unnecessary. Optionally, after that, the trench can be filled with an insulation or absorber material.

In terms of the materials that can be used and the further construction, there are in principle no limitations to the invention. GaAs- or InP-based systems can for instance be used as the semiconductors, especially InGaAlAs, InGaN, InGaAsP, or InGaAlP.

Figure 2A:
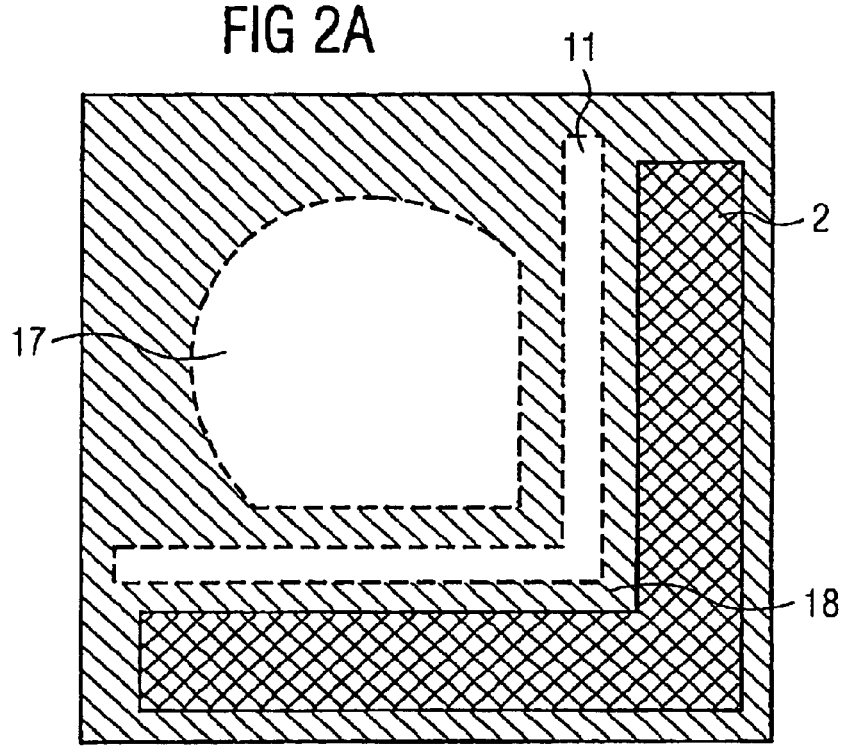
FIG. 2A shows a schematic sectional plan view on contact face 2 of a second exemplary embodiment of the invention.

FIG. 2A shows the plan view on the contact face 2, on the decoupling side, of a second exemplary embodiment of the invention. This contact face is V-shaped, with a right angle between the two legs of the V. The insulation layer 11 is likewise V-shaped in its cross section and thus corresponds to the shape of the contact face 2. The cutout 17 in the surface represents the conductive inner region of the current-constriction layer 10.

Figure 2B:
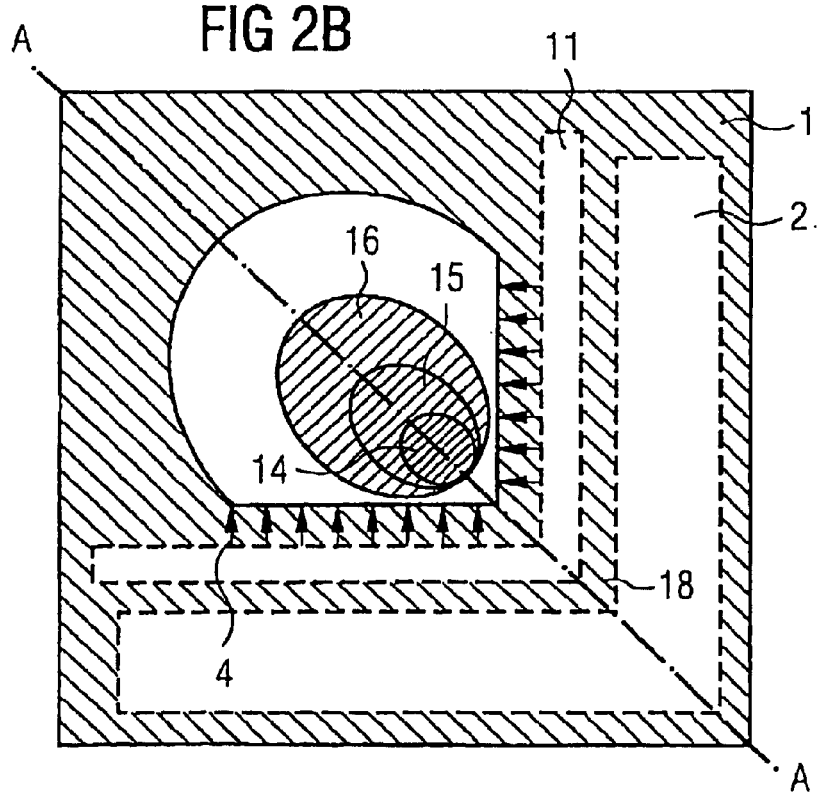
FIG. 2B shows the same view as FIG. 2A, with the addition of a schematic illustration of the effect of a V-shaped contact face.

In FIG. 2B, the effect of the V-shaped contact face is illustrated schematically. At a low pump current 4, an occupation inversion in the vicinity of the V-contact apex 18 is generated only in a small region 14. As the pump current increases, the population-inverted region increases in size, and the, active volume is enlarged. This is due to the superposition of the portions of the pump current that are injected by the two legs of the V and is made possible by the defined radial current delivery to the opening of the current-constriction layer 10 effected through the insulation layer 11.

The enlargement of the active volume with increasing pump current 4 results in a self-regulating behavior of the VCSEL, in the following context:

For stable operation of a laser with a Fabry-Perot resonator, of the kind also used in the VCSEL, a so-called mode aperture is necessary, since a Fabry-Perot resonator, particularly in the form in which it is used for VCSELs, has only a very slight transversal mode selectivity. A Fabry-Perot resonator is therefore only limitedly stable. The mode aperture defines the transversal length of the resonator mode.

In a VCSEL, a mode aperture is formed by the active volume in the form of an active aperture. On the one hand, this active volume must be selected as small enough to attain a high pump density. On the other, with increasing reduction in size of the active volume, the production cost rises sharply, while the optical output power drops.

A mode aperture of fixed dimensions is therefore adapted to precisely one certain output power and is optimal only for that output power.

In addition, as the pump current increases, a thermal lens also develops in the active volume, leading to a change in the fundamental mode in the form of a constriction. This also changes the field distribution in the resonator, so that the fundamental mode is no longer adapted to the original dimensions of the mode aperture. As a consequence of this maladaptation, unwanted higher modes can be stimulated to oscillate, causing the fundamental mode to be attenuated or even extinguished.

The maladaptation can be compensated for providing that the active volume, and thus the fundamental mode as well, are transversely enlarged as the pump current increases, which counteracts a constriction.

In an open contact like the V-shaped contact shown in FIGS. 2A and 2B, when the pump current 4 is slight a small active volume 14 develops in the interior of the contact region and enlarges in the direction of the contact opening as the pump current 4 increases. FIG. 2B schematically shows the active volume 15 when the pump current is at a medium level and the active volume 16 when the pump current is high.

Thus an open contact brings about a self-regulating behavior of a VCSEL, which counteracts a maladaptation between the fundamental mode and the active volume.

Figure 3A:
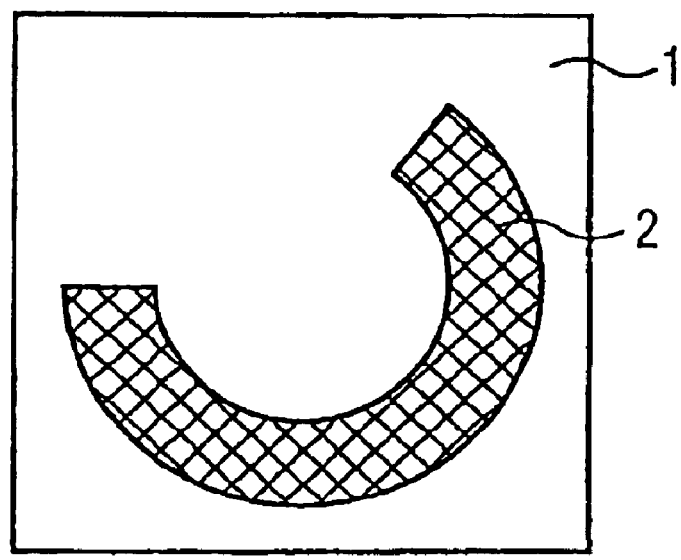
FIG. 3A shows a schematic sectional view similar to that of FIG. 2A illustrating an open contact shape of a third exemplary embodiment of the invention.
Figure 3B:
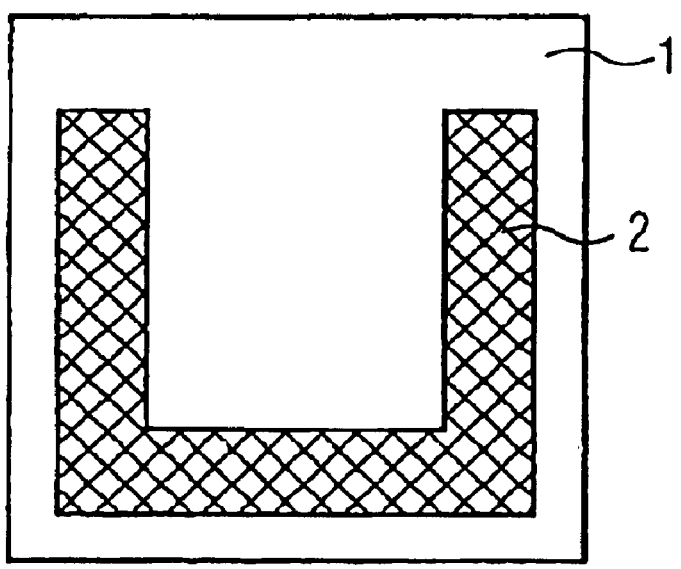
FIG. 3B shows a schematic sectional view similar to that of FIG. 3A illustrating a different open contact shape.

In FIGS. 3A and 3B, further open contact shapes are shown, which likewise bring about the aforementioned broadening of the active volume as the pump current 4 increases.

For instance, the contact 2 can be embodied in the form of a contact ring, from which an annular sector is cut out (FIG. 3A). Another exemplary embodiment comprises making the contact 2 U-shaped, as shown in FIG. 3B. In the invention, the shape of the contact face can advantageously be varied easily in the production of the contact face 2, by changing the masking of the decoupling face.

It is understood that the contact 2 can also be embodied as completely annular, if the only goal is to avoid a thermal lens in the resonator volume as noted, without any self-regulating behavior.

Figure 4A:
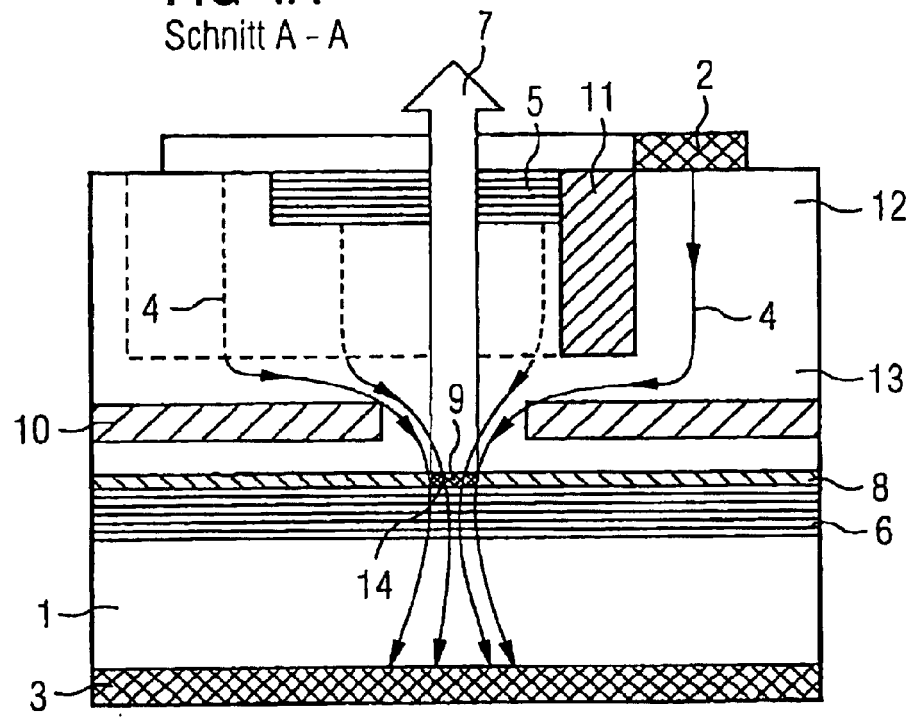
FIG. 4A shows a sectional view taken along line A—A in FIG. 2B and illustrating the effect created by a small pump current.
Figure 4B:
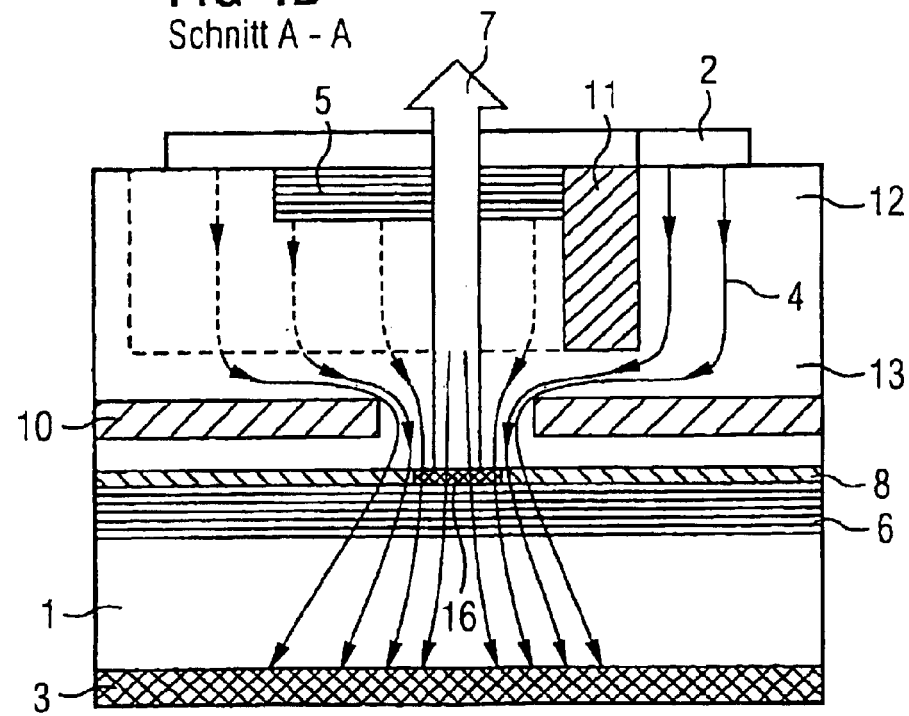
FIG. 4B shows the same view as in FIG. 4A, and illustrates the effect created by a greater pump current.

In FIGS. 4A and 4B, sectional views of the effect of the open contact shape are shown for various pump currents.

The sectional plane here is selected such that the resonator axis is located in the sectional plane, and the sectional plane extends diagonally (line A—A, FIG. 2B) through the plan view shown in FIG. 2B.

For slight pump currents, a small active volume 14 develops; see FIG. 4A Correspondingly, the VCSEL advantageously has a very low pump threshold. As the pump current increases, in a VCSEL of the prior art with a fixed active volume in the active layer, a powerful thermal lens would develop; the fundamental mode would become constricted; and higher modes could be stimulated to oscillate.

In the invention, conversely, the active volume 14 lengthens in the radial direction; see FIG. 4B. The larger active volume 16 has the effect that the fundamental mode also lengthens radially and counteracts a constriction. Moreover, with the lengthening of the active volume, the heat loss is also better distributed, and the radial temperature gradient, which definitively determines the force of diffraction of the thermal lens, is advantageously reduced.

It is understood that the explanation of the invention in terms of the exemplary embodiments described is not to be understood as a limitation of the scope of the invention.

What is claimed is:

1. A VCSEL having a semiconductor body (1), which has a resonator volume, with a resonator axis, an active layer (8) that includes an active volume (9) that generates a radiation (7), and a first and second primary face, a first contact face (2) being formed on the first primary face and a second contact face (3) being formed on the second primary face, and in which the generated radiation (7) is decoupled at least in part through the first primary face, characterized in that the pump current (4) in a first region (12) is guided from the first primary face to the active layer (8), outside the resonator volume, predominantly parallel to the resonator axis; and that in a second region (13), the pump current (4) is carried to the active volume (9) predominantly perpendicular to the resonator axis, and an insulation layer (11) is embodied between the first region (12) and the resonator volume.

2. The VCSEL of claim 1, characterized in that between the second region (13) and the active layer (8), a current-constriction layer (10) is embodied.

3. The VCSEL of claim 2, characterized in that the current-constriction layer (10) has an aperture which, viewed along the resonator axis, at least partly overlaps the active volume (9).

4. The VCSEL of claim 2, characterized in that the current-constriction layer (10) is formed by ion implantation.

5. The VCSEL of claim 2, characterized in that the current-constriction layer (10) is an annular oxide layer.

6. The VCSEL of claim 1, characterized in that the insulation layer (11) is formed by ion implantation.

7. The VCSEL of claim 1, characterized in that the insulation layer (11) is formed by means of an etched trench.

8. The VCSEL of claim 7, characterized in that the etched trench is filled with an insulation or absorber material.

9. The VCSEL of claim 1, characterized in that the contact face (2) is formed annularly, and the generated radiation (7) exits through the annular opening.

10. The VCSEL of claim 1,
characterized in that the first contact face (2) is formed annularly, and the ring is not closed.

11. The VCSEL of claim 1,
characterized in that
the first contact face (2) is embodied as U-shaped.

12. The VCSEL of claim 1,
characterized in that
the first contact face (2) is embodied as V-shaped.

13. The VCSEL of claim 1,
characterized in that
the insulation layer (11) has a lateral cross section which corresponds to the shape of the contact face (2).

14. The VCSEL of claim 1,
characterized in that
the contact face (2) is shaped such that with an increasing pump current (4), the lateral cross-sectional face of the active volume (9) remains the same or increases.

* * * * *